(12) United States Patent
Shimazawa et al.

(10) Patent No.: US 7,826,179 B2
(45) Date of Patent: Nov. 2, 2010

(54) MAGNETO-RESISTIVE EFFECT DEVICE OF THE CPP STRUCTURE AND MAGNETIC DISK SYSTEM

(75) Inventors: Koji Shimazawa, Tokyo (JP); Tsutomu Chou, Tokyo (JP); Yoshihiro Tsuchiya, Tokyo (JP)

(73) Assignee: TDK Corporation, Tokyo (JP)

( * ) Notice: Subject to any disclaimer, the term of this patent is extended or adjusted under 35 U.S.C. 154(b) by 636 days.

(21) Appl. No.: 11/856,438

(22) Filed: Sep. 17, 2007

(65) Prior Publication Data

US 2009/0073616 A1 Mar. 19, 2009

(51) Int. Cl.
*G11B 5/39* (2006.01)
(52) U.S. Cl. ..................................... 360/319
(58) Field of Classification Search .................. 360/319
See application file for complete search history.

(56) References Cited

U.S. PATENT DOCUMENTS

| | | | |
|---|---|---|---|
| 6,275,360 B1 * | 8/2001 | Nakamoto et al. | 360/319 |
| 6,292,334 B1 * | 9/2001 | Koike et al. | 360/319 |
| 6,381,107 B1 | 4/2002 | Redon et al. | |
| 6,680,830 B2 | 1/2004 | Gill | |
| 6,914,759 B2 | 7/2005 | Chen et al. | |
| 6,980,403 B2 * | 12/2005 | Hasegawa | 360/319 |
| 7,019,943 B2 * | 3/2006 | Sato | 360/125.71 |
| 7,035,062 B1 | 4/2006 | Mao et al. | |
| 7,280,320 B2 * | 10/2007 | Sato et al. | 360/317 |
| 2007/0211391 A1 | 9/2007 | Hirata et al. | |

FOREIGN PATENT DOCUMENTS

JP 2002-171013 6/2002

OTHER PUBLICATIONS

U.S. Appl. No. 12/014,575, filed Jan. 15, 2008, Chou, et al.
U.S. Appl. No. 12/022,538, filed Jan. 30, 2008, Chou, et al.
U.S. Appl. No. 12/255,105, filed Oct. 21, 2008, Chou, et al.

* cited by examiner

*Primary Examiner*—Mark Blouin
(74) *Attorney, Agent, or Firm*—Oblon, Spivak, McClelland, Maier & Neustadt, L.L.P.

(57) ABSTRACT

The invention provides a magneto-resistive effect device of the CPP (current perpendicular to plane) structure, comprising a magneto-resistive effect unit, and an upper shield layer and a lower shield layer located with that magneto-resistive effect unit sandwiched between them, with a sense current applied in a stacking direction, wherein the magneto-resistive effect unit comprises a nonmagnetic metal intermediate layer, and a first ferromagnetic layer and a second ferromagnetic layer stacked and formed with that nonmagnetic metal intermediate layer sandwiched between them, wherein the first ferromagnetic layer and said second ferromagnetic layer are exchange coupled via the nonmagnetic metal intermediate layer such that where there is no bias magnetic field applied as yet, their magnetizations are anti-parallel with each other, and at least one of the upper shield layer and the lower shield layer has an inclined magnetization structure with its magnetization inclining with respect to a track width direction, so that by the magnetization of that inclined magnetization structure, a bias magnetic field can be applied to the first ferromagnetic layer and the second ferromagnetic layer. It is thus possible to obtain a magneto-resistive effect device of improved reliability that enables a structure capable of having a narrowed read gap (the gap between the upper shield and the lower shield) to be adopted to meet the recently demanded ultra-high recording density, allows a stable bias magnetic field to be applied in simple structure, and obtain a stable magneto-resistive effect change.

10 Claims, 12 Drawing Sheets

MAGNETO-RESISTIVE EFFECT DEVICE OF THE CPP STRUCTURE AND MAGNETIC DISK SYSTEM

BACKGROUND OF THE INVENTION

1. Field of the Invention

The present invention relates to a magneto-resistive effect device adapted to read the magnetic field intensity of magnetic recording media or the like as signals, a thin-film magnetic head comprising that magneto-resistive effect device, and a head gimbal assembly and a magnetic disk system including that thin-film magnetic head.

2. Explanation of the Prior Art

In recent years, with an increase in the recording density of hard disks (HDDs), there have been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often called the MR device for short) and a recording head having a write-only induction type magnetic device are stacked together.

The magneto-resistive effect device (CIP-GMR device) of the so-called CIP (current in plane) structure that operates on currents flowing parallel with the film plane of the device—called a spin valve GMR device—is now widely employed as the reproducing head. The spin valve GMR device of such structure is positioned between upper and lower shield layers each formed of a soft magnetic metal film, and sandwiched between insulating layers called gap layers. Recording density in the bit direction is determined by the gap (reproducing gap) between the upper and lower shield layers.

With an increase in the recording density, there has been a growing demand for narrower shield gaps and narrower tracks. As the reproducing head track grows narrow with a decreasing device height, so does the device area; however, with the prior art structure, there is an operating current limited from the standpoint of reliability, because there is heat dissipation efficiency decreasing with a decreasing area.

To solve such a problem, there is a GMR device of the CPP (current perpendicular to plane) structure (CPP-GMR device) proposed in the art, in which upper and lower shield layers and a magneto-resistive effect device are connected electrically in series to make do without any insulating layer between the shields. This technology is thought of as inevitable to achieve such recording densities as exceeding 200 Gbits/in$^2$.

Such a CPP-GMR device has a multilayer structure comprising a first ferromagnetic layer and a second ferromagnetic layer between which an electroconductive, nonmagnetic intermediate layer is sandwiched. A typical multilayer structure for the spin valve type CPP-GMR device comprises, in order from a substrate side, a lower electrode/antiferromagnetic layer/first ferromagnetic layer/electroconductive, non-magnetic layer/second ferro-magnetic layer/upper electrode stacked together in order.

The direction of magnetization of the first ferro-magnetic layer that is one of the ferromagnetic layers remains fixed such that when the externally applied magnetic field is zero, it is perpendicular to the direction of magnetization of the second ferromagnetic layer. The fixation of the direction of magnetization of the first ferromagnetic layer is achieved by the exchange coupling of it with an antiferromagnetic layer provided adjacent to it, whereby unidirectional anisotropic energy (also called the "exchange bias" or "coupled magnetic field") is applied to the first ferromagnetic layer. For this reason, the first ferromagnetic layer is also called the fixed magnetization layer. By contrast, the second ferromagnetic layer is also called the free layer. Further, if the fixed magnetization layer (the first ferromagnetic layer) is configured as a triple-layer structure of a ferromagnetic layer/nonmagnetic metal layer/ferromagnetic layer (the so-called "multilayer ferri-structure" or "synthetic pinned layer"), it is then possible to effectively increase the exchange coupling force from the antiferromagnetic layer, and to reduce the influences on the free layer of a static magnetic field resulting from the fixed magnetization layer. Thus, the "synthetic pinned structure" is now in extensive use.

However, a further slimming-down of the magneto-resistive effect device is in great need so as to meet a recent demand for ultra-high recording density. In such situations, there is a novel GMR device structure put forward, which has a basic structure comprising a simple triple-layer arrangement of ferromagnetic layer/non-magnetic intermediate layer/ferromagnetic layer, as set forth in U.S. Pat. No. 7,019,371B2 or U.S. Pat. No. 7,035,062B1. In such a new GMR device structure, the two ferromagnetic layers are exchange coupled together such that their magnetizations are anti-parallel with each other. And, according the proposal of U.S. Pat. No. 7,035,062B1, a permanent magnet 500 is located in the depth position facing away from the ABS corresponding to the medium opposite plane of the device, as shown in FIG. 14, so that under the action of a bias magnetic field given out of the permanent magnet 500, there is an initial state created in which the magnetizations of two magnetic layers 411 and 415 are inclined about 45° with respect to the track width direction. Upon detection of a signal magnetic field from the medium in the initial state of the device, the directions of magnetization of the two magnetic layers change as if scissors cut paper, with the result that there is a change in the resistance value of the device. In the present disclosure, this new device structure may be called the "scissors type GMR device".

As such a "scissors type GMR device" is applied to the CPP-GMR device, it enables the read gap G that is the gap between the upper and lower shield layers 501 and 505 to be much narrower than could be achieved with a general spin valve type CPP-GMR device (see FIG. 14). Specifically, it is possible to make do without the anti-ferromagnetic layer thought of as necessary for the general spin valve type CPP-GMR device, and dispense with the ferromagnetic layers in the "synthetic pinned structure" as well.

With a head structure using the "scissors type GMR device", however, it is necessary to make the permanent magnet 500 thicker to allow the permanent magnet 500 of CoPt or the like located in the rear of the device as shown in FIG. 14 to give out a bias magnetic field intensity high enough to create the initial state. That the permanent magnet 500 grows thick means that it is impossible to take full advantage of the merit of the scissors type GMR device of being narrow in the read gap G. Further, as shown in FIG. 14, the narrower the read gap G, the smaller the gap between the permanent magnet 500 and the upper and lower shield layers 501, 505 becomes: there is a problem that the bias magnetic field given out of the permanent magnet 500 goes through the upper and lower shield layers 501, 505, and becomes insufficient to make sure a sufficient resistance change in the device.

The situations being like this, an object of the present invention is to provide a magneto-resistive effect device of improved reliability that enables a structure capable of having a narrowed read gap (the gap between the upper shield and the lower shield) to be adopted to meet the recently demanded ultra-high recording density, allows a stable bias magnetic field to be applied in simple structure, and obtain a stable magneto-resistive effect change as well as a thin-film magnetic head comprising that magneto-resistive effect device, and a head gimbal assembly and magnetic disk system including that thin-film magnetic head.

SUMMARY OF THE INVENTION

According to the present invention, the aforesaid object is accomplishable by the provision of a magneto-resistive effect device of the CPP (current perpendicular to plane) structure, comprising a magneto-resistive effect unit, and an upper shield layer and a lower shield layer located and formed with that magneto-resistive effect unit sandwiched between them, with a sense current applied in a stacking direction, wherein said magneto-resistive effect unit comprises a nonmagnetic metal intermediate layer, and a first ferromagnetic layer and a second ferromagnetic layer stacked and formed with that nonmagnetic metal intermediate layer sandwiched between them, wherein said first ferromagnetic layer and said second ferromagnetic layer are exchange coupled via the nonmagnetic metal intermediate layer such that where there is no bias magnetic field applied, their magnetizations are anti-parallel with each other, and at least one of said upper shield layer and said lower shield layer has an inclined magnetization structure with its magnetization inclining with respect to a track width direction, so that by magnetization of that inclined magnetization structure, a bias magnetic field can be applied to said first ferromagnetic layer and said second ferromagnetic layer, wherein said inclined magnetization structure has a degree of inclination of magnetization such that while said upper shield layer and said lower shield layer maintain their own shield function, substantial orthogonal intersection of magnetization of said first ferromagnetic layer and magnetization of said second ferromagnetic layer is achievable.

In a preferable embodiment of the magneto-resistive effect device of the invention, the inclined magnetization structure formed at said at least one shield layer is formed by exchange coupling with an antiferromagnetic member adjacent to said shield layer.

In a preferable embodiment of the magneto-resistive effect device of the invention, the inclined magnetization structure formed at said at least one shield layer is formed by application of an induced magnetic anisotropy to said shield layer.

In a preferable embodiment of the magneto-resistive effect device of the invention, by heat treatment in a magnetic field, the induced magnetic anisotropy is applied to said at least one shield layer.

In a preferable embodiment of the magneto-resistive effect device of the invention, a flux guide layer is formed more in the rear of the rear end of said magneto-resistive effect device such that said bias magnetic field is pulled from the medium opposite plane of the magneto-resistive effect device in the rear end of the device.

In a preferable embodiment of the magneto-resistive effect device of the invention, the gap defined by a gap said upper shield layer and said lower shield layer is 30 nm or less.

In a preferable embodiment of the magneto-resistive effect device of the invention, the substantial orthogonal intersection of magnetization of said first ferromagnetic layer and magnetization of said second ferromagnetic layer is in the range of $90°\pm15°$.

The invention also provides a thin-film magnetic head, comprising a plane in opposition to a recording medium, and the aforesaid magneto-resistive effect that is located near said medium opposite plane to detect a signal magnetic field from said recording medium.

Further, the invention provides a head gimbal assembly, comprising a slider including the aforesaid thin-film magnetic head and located in opposition to the recording medium, and a suspension adapted to resiliently support said slider.

Still further, the invention provides a hard disk system, comprising a slider including the aforesaid thin-film magnetic head and located in such a way as to oppose to a recording medium, and a positioning device adapted to support and position said slider with respect to said recording medium.

DETAILED EXPLANATION OF THE PREFERRED EMBODIMENTS

Figure 1:
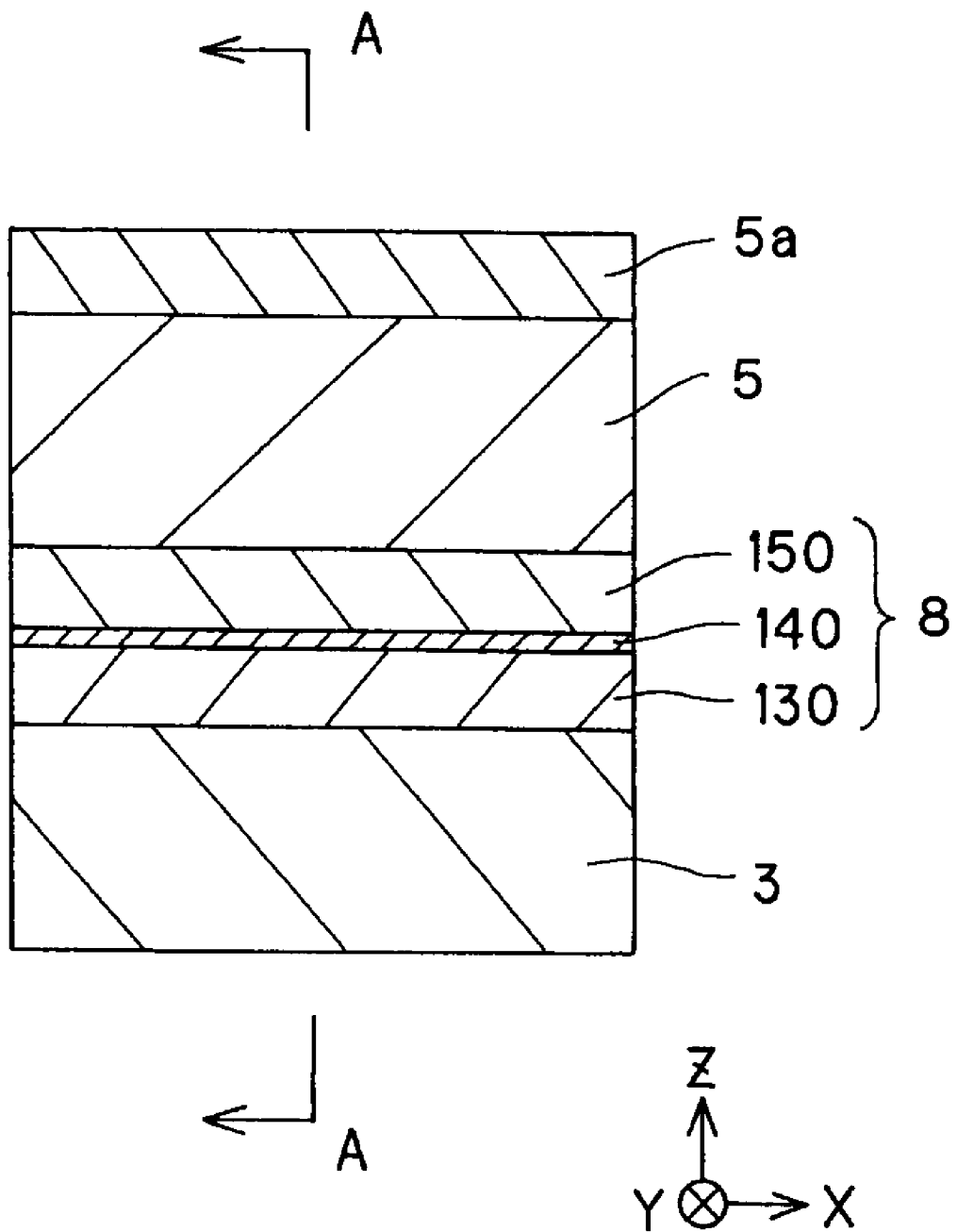
FIG. 1 is illustrative of the section parallel with the medium opposite plane of the magneto-resistive effect device in an embodiment of the invention.

The best mode for carrying out the invention is now explained in greater details.

The magneto-resistive effect device of the invention is preferably used with a thin-film magnetic head in general, and its reproducing head in particular.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

FIG. 1 is illustrative of the ABS (air bearing surface) of the reproducing head in an embodiment of the invention; FIG. 1 is illustrative in schematic of the ABS of the magneto-resistive effect device (CPP-MR device) having a CPP structure—part of the invention in particular. The ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC (the protective layer adapted to cover the device) or the like, in a strict sense, positioned facing the medium opposite plane may be factored out, if necessary.

Figure 2:
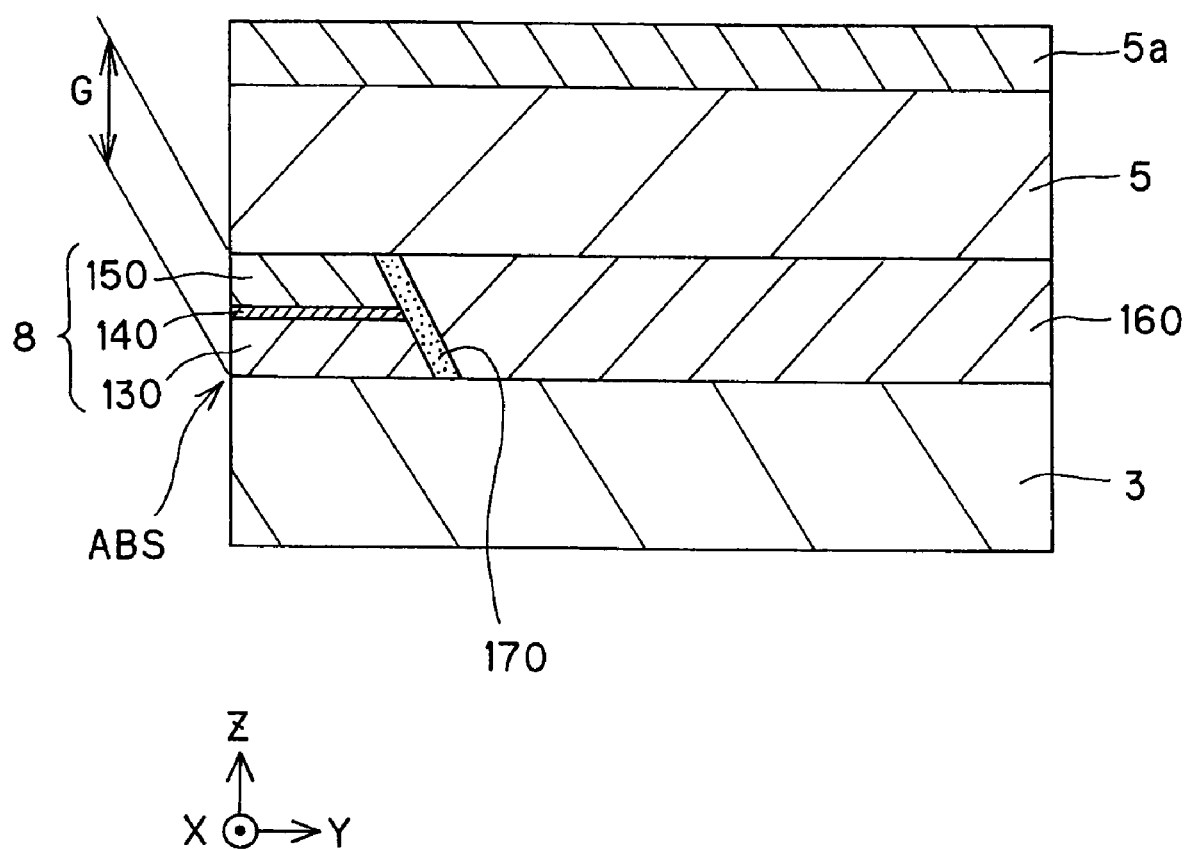
FIG. 2 is a view as taken on arrowed line A-A of FIG. 1.

FIG. 2 is illustrative of the construction of the setup of the magneto-resistive effect device in one preferred embodiment of the invention: it is a view as taken on section A-A of FIG. 1.

Figure 3:
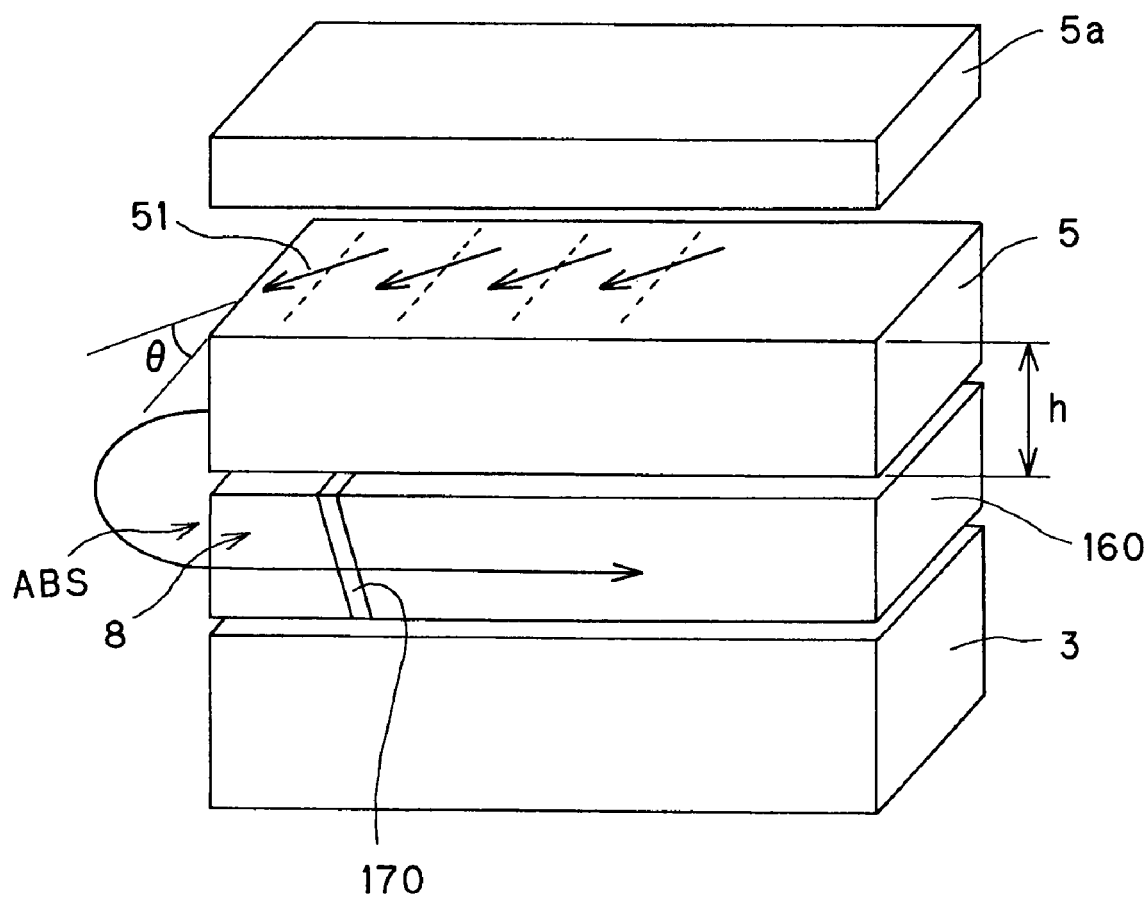
FIG. 3 is an exploded, perspective view of components for illustrating the structure of the magneto-resistive effect device in one preferable embodiment of the invention.

FIG. 3 is illustrative of the setup of the magneto-resistive effect device in one preferred embodiment of the invention: it is an exploded, perspective view of components.

Figure 4:
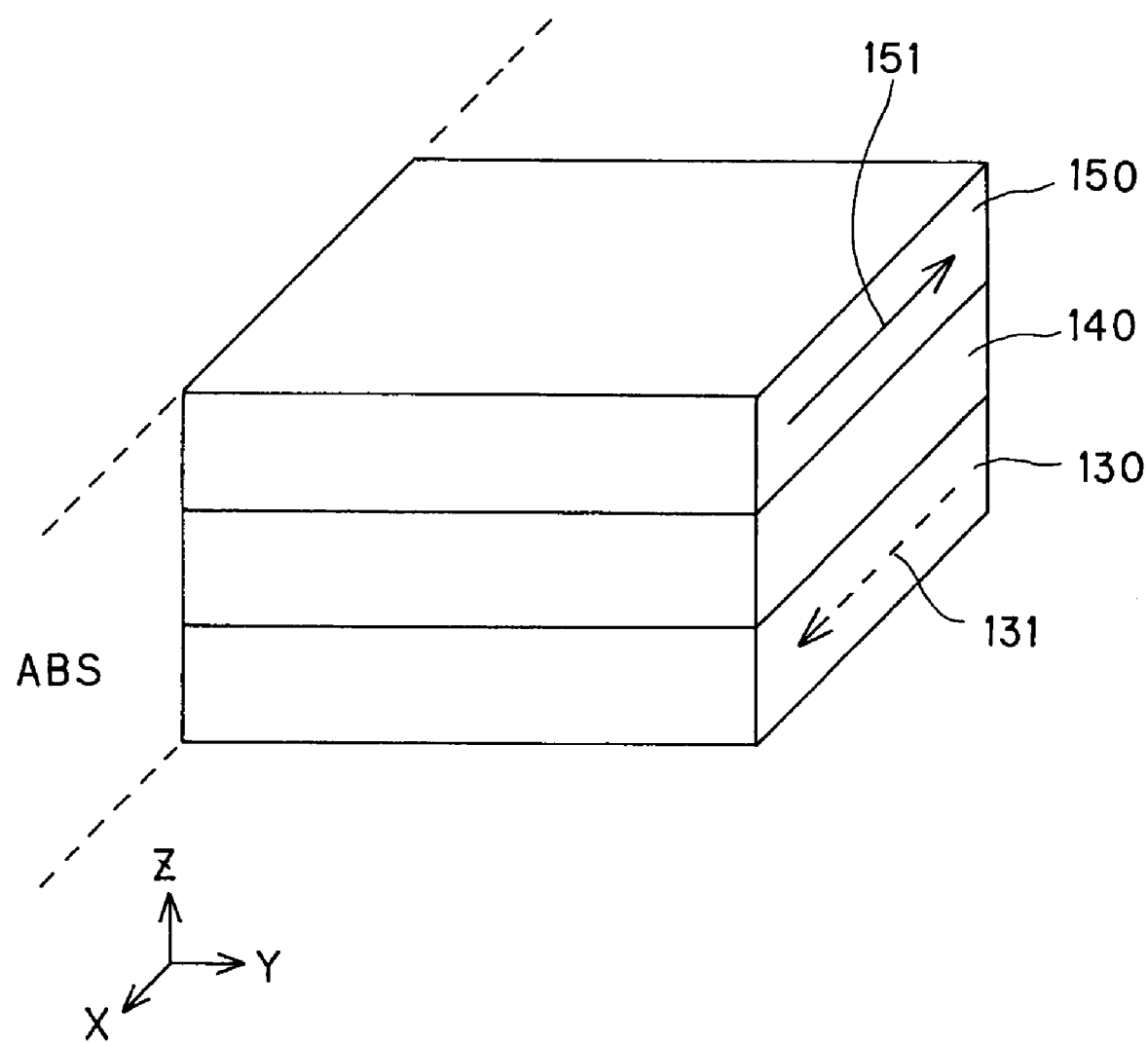
FIG. 4 is a perspective model representation of part of the magneto-resistive effect device of the invention.

FIG. 4 is a perspective model view of part of the magneto-resistive effect device used with the thin-film magnetic head of the invention.

Figure 5A:
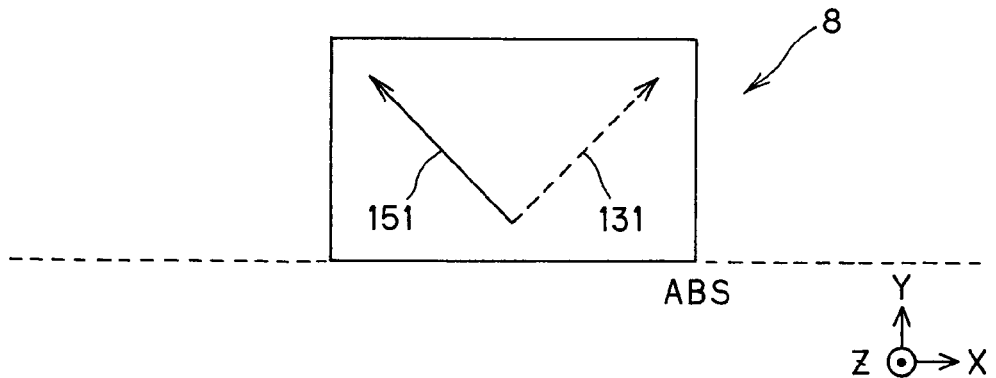
FIGS. 5A, 5B and 5C are model representations illustrative of state changes of magnetization depending on an external magnetic field, respectively, in which there are changes in the magneto-resistive effect of the magneto-resistive effect device of the invention.
Figure 5B:
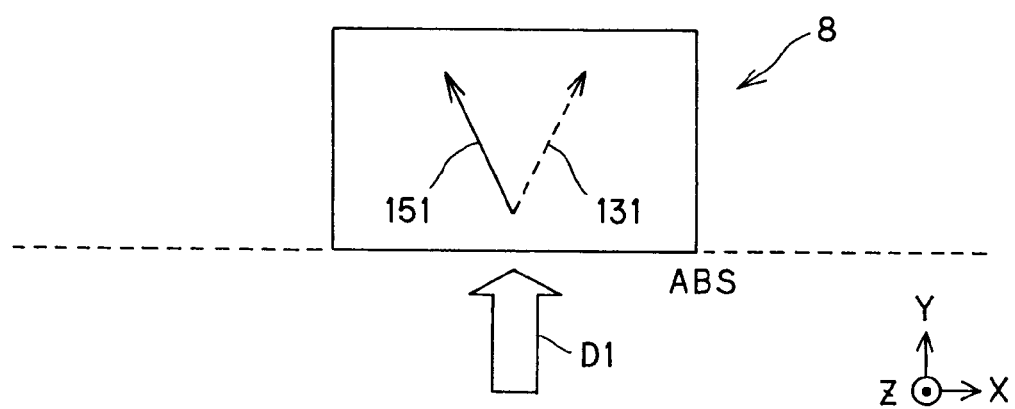
Figure 5C:
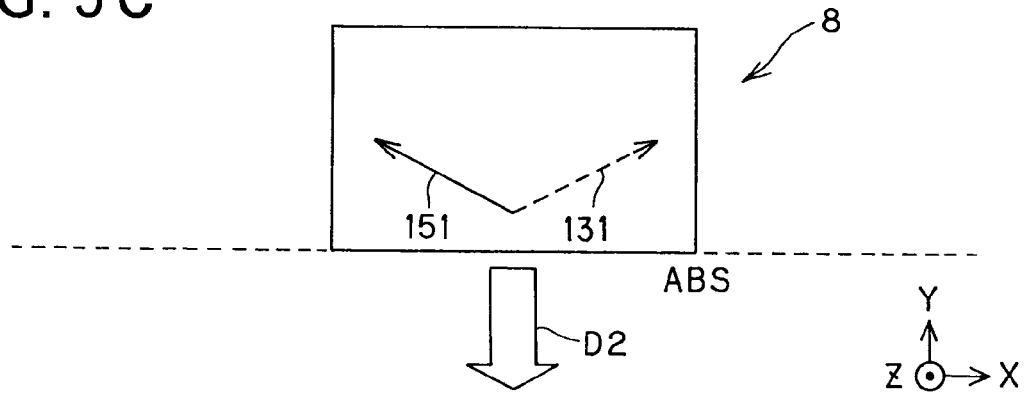

FIGS. 5A, 5B and 5C are each a model view illustrative, depending on an external magnetic field, of changes in the state of magnetization where there are changes in the magneto-resistive effect of the thin-film magnetic head of the invention.

[Explanation of the Structure of the Magneto-Resistive Effect Device]

As shown in FIGS. 1, 2 and 3, the magneto-resistive effect device of the invention comprises a magneto-resistive effect unit 8, and an upper shield layer 5 and a lower shield layer 3 located with that magneto-resistive effect unit 8 sandwiched between them.

The magneto-resistive effect unit 8 comprises a nonmagnetic metal intermediate layer 140, and a first ferromagnetic layer 130 and a second ferromagnetic layer 150 stacked together with that nonmagnetic metal intermediate layer 140 sandwiched between them. That is, there is the magneto-resistive effect device of the CPP (current perpendicular to plane) structure involved, with the sense current applied in that stacking direction.

In general, the upper 5 and the lower shield layer 3 also function as electrodes for passing the sense current. In the present disclosure, the upper 5 and the lower shield layer 3 are thus also called the upper read shield layer 5 and the lower read shield layer 3. Alternatively, another electrode layer may be added to and stacked on such shield layers 5 and 3.

With no bias magnetic field applied to the first 130 and the second ferromagnetic layer 150 as yet, they are exchange coupled together via the nonmagnetic metal intermediate layer 140 such their magnetizations are anti-parallel with each other. This state is shown in FIG. 4: the magnetization 131 of the first ferromagnetic layer 130 and the magnetization 151 of the second ferromagnetic layer 150 are anti-parallel with each other.

The characteristic structure of part of the invention is that at least one of the upper 5 and the lower shield layer 3 has an inclined magnetization structure where its magnetization inclines with respect to the track width direction (the X-axis direction). In the inclined magnetization structure depicted in FIG. 3, the magnetization 51 of the upper shield layer 5 inclines at an angle θ with respect to the track width direction (the X-axis direction).

The magnetization 51 of that inclined magnetization structure allows a bias magnetic field to be applied to the first 130 and the second ferromagnetic layer 150 that form a part of the magneto-resistive effect unit 8. The degree of inclination of the magnetization 51 of the inclined magnetization structure should be such that while the upper 5 and the lower shield layer 3 maintain their own shield function, the magnetizations of the first 130 and the second ferromagnetic layer 150 that form a part of the magneto-resistive effect unit 8 are substantially orthogonal to each other: they should be substantially orthogonal to each other in the range of 90°±15°. In the state of intersection of the magnetizations 131 and 151 shown in FIG. 5A, substantial orthogonal intersection is achieved.

A conventional, general approach to allowing the upper 5 and the lower shield layer 3 to have magnetic shield functions is to magnetize them in the track width direction (the X-axis direction). In other words, the approach of the invention to intentionally forming the inclined magnetization structure at the shield layer so that, by the application of a bias magnetic field to the first 130 and the second ferromagnetic layer 150 that form a part of the magneto-resistive effect unit 8, the state of substantial orthogonal intersection of the magnetizations 131 and 151 shown in FIG. 5A is achievable is an unheard-of, quite novel idea.

As already noted, the degree of inclination of the magnetization 51 of the inclined magnetization structure should be such that while the upper 5 and the lower shield layer 3 maintain their own shield function, the magnetizations of the first 130 and the second ferromagnetic layer 150 that form a part of the magneto-resistive effect unit 8 are substantially orthogonal to each other. More specifically, the angle θ of inclination of the magnetization 51 with respect to the track width direction (the X-axis direction) should be 5 to 60°, preferably 20 to 55, and more preferably 30 to 50°, as shown in FIG. 3. As the value of θ is below 5°, no sufficient bias magnetic field can be applied; the substantial orthogonal intersection of both magnetizations of the first 130 and the second ferromagnetic layer 150 would be hardly achievable. As the value of θ is greater than 60°, on the other hand, the magnetic shield effect that both the layers should have would not be obtainable.

The value of θ may optionally be set in favor of the degree of intensity of exchange coupling of the first 130 and the second ferromagnetic layer 150, the thickness of the bias-applying shield layers, the material that forms the shield layers, the distance between the shield layers and the first 130 and the second ferromagnetic layer 150, each functions as the free layer, etc.

One method for providing the inclined magnetization structure formed at the shield layer (the upper 5, and the lower shield layer 3) is to form it via exchange coupling with an antiferromagnetic member adjacent to the shield layer. That method is typically shown in FIG. 3: an anti-ferromagnetic member 5a is formed on the upper shield layer 5 so that by exchange coupling with the anti-ferromagnetic member 5a, the magnetization 51 of the upper shield layer 5 is inclined at a given angle θ with respect to the track width direction (the X-axis direction).

Another method is to apply induced magnetic anisotropy to the shield layer thereby forming the inclined magnetization structure. For instance, while the shield layer is being formed or after it is formed, it may be heat treated in a magnetic field (for instance, heat treated at 250° C. in a magnetic field of 200 Oe for 3 hours), thereby forming the inclined magnetization structure at the shield layer.

Alternatively, as shown in FIG. 3, a flux guide layer 160 may be formed at a site more in the rear of the rear end of the magneto-resistive effect unit 8 such that a bias magnetic field applied from the shield layer (the upper shield layer 5 in FIG. 3) is guided from the medium opposite plane ABS of the magneto-resistive effect unit 8 to the rear end of the magneto-resistive effect unit 8. Usually, the flux guide layer 160 is formed via a non-magnetic insulating layer 170 located at the rear end of the magneto-resistive effect device.

In the invention, a shield-to-shield gap G (read gap G) defined by a gap between the upper 5 and the lower shield layer 3 should be 30 nm or less, especially 12 to 30 nm, and more especially 15 to 25 nm, as shown in FIG. 2; it is another object of the invention to make the read gap (between the upper and the lower shield layer) narrow to improve the linear recording density.

[Explanation of the Material for Each of the Components that Form the Magneto-Resistive Effect Device]

The material for each of the components that form the aforesaid magneto-resistive effect device is now explained.

First 130 and Second Ferromagnetic Layer 150:

There is the mention of NiFe, CoFe, CoFeB, CoFeNi, $Co_2MnSi$, $Co_2MnGe$, $FeO_x$ (the oxide of Fe), $CoO_x$ (the oxide of Co), etc.

Each layer should have a thickness of about 0.5 to 8 nm.

These layers function as the so-called free layers that vary in the direction of magnetization under the influences of an externally applied magnetic field.

Nonmagnetic Metal Intermediate Layer 140:

There is the mention of Ru, Ir, Rh, Cr, Cu, Zn, Ga, ZnO, InO, SnO, GaN, ITO (indium tin oxide), etc.

The layer should have a thickness of about 0.5 to 5 nm.

Upper 5 and Lower Shield Layer 3:

There is the mention of NiFe, CoZrTa, Sendust, NiFeCo, CoZrNb, etc.

Each layer should have a thickness of about 20 nm to 3 μm.

Antiferromagnetic Member 5a:

The antiferromagnetic layer 5a works such that by way of exchange coupling with the shield layer, the magnetization direction of the shield layer stays fixed.

For instance, the antiferromagnetic member 5a is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic member 5a should have a thickness of about 3 to 100 nm.

Flux Guide Layer 160:

There is the mention of NiFe, CoZrTa, NiFeCo, CoZrNb, etc.

Nonmagnetic Insulating Layer 170:

There is the mention of $Al_2O_3$, $SiO_2$, $SiO_xN_y$, MgO, $HfO_2$, $TiO_2$, DLC (diamond carbon), etc.

[Explanation of How the Magneto-Resistive Effect Device Works]

How the inventive magneto-resistive effect device works is now explained with reference to FIG. 4 as well as FIGS. 5A, 5B and 5C.

With no applied bias magnetic field as yet, the first 130 and the second ferromagnetic layer 150 are exchange coupled together via the nonmagnetic metal intermediate layer 140 such that their magnetizations 131 and 151 are anti-parallel with each other, as shown in FIG. 4.

By the magnetization of the inclined magnetization structure formed in at least one of the upper 5 and the lower shield layer 3, the bias magnetic field is applied to the first 130 and the second ferromagnetic layer 150 so that the substantial orthogonal intersection of the magnetizations 131 and 151 of the first 130 and the second ferromagnetic layer 150 is achieved, turning up the state depicted in FIG. 5A. This state is the initial one of the magneto-resistive effect device (magneto-resistive effect unit 8).

Upon detection of an external magnetic field D1 in a direction from the ABS toward the device side as shown in FIG. 5B, the magnetizations 131 and 151 of the first 130 and the second ferromagnetic layer 150 can align in the same direction, resulting in a decrease in the resistance of the device.

Upon detection of an external magnetic field D2 in a direction away from the ABS as shown in FIG. 5C, on the other hand, the magnetizations 131 and 151 of the first 130 and the second ferromagnetic layer 150 can lie in the opposite directions, resulting in an increase in the resistance of the device.

By measuring a series of resistance changes depending on such external magnetic fields, it is possible to detect the external magnetic field.

[Explanation of the Whole Structure of the Thin-Film Magnetic Head]

One preferable construction of the whole structure of the thin-film magnetic head according to the invention is now explained with reference to FIGS. 6A, 6B, 7 and 8.

Figures 6A, 6B:
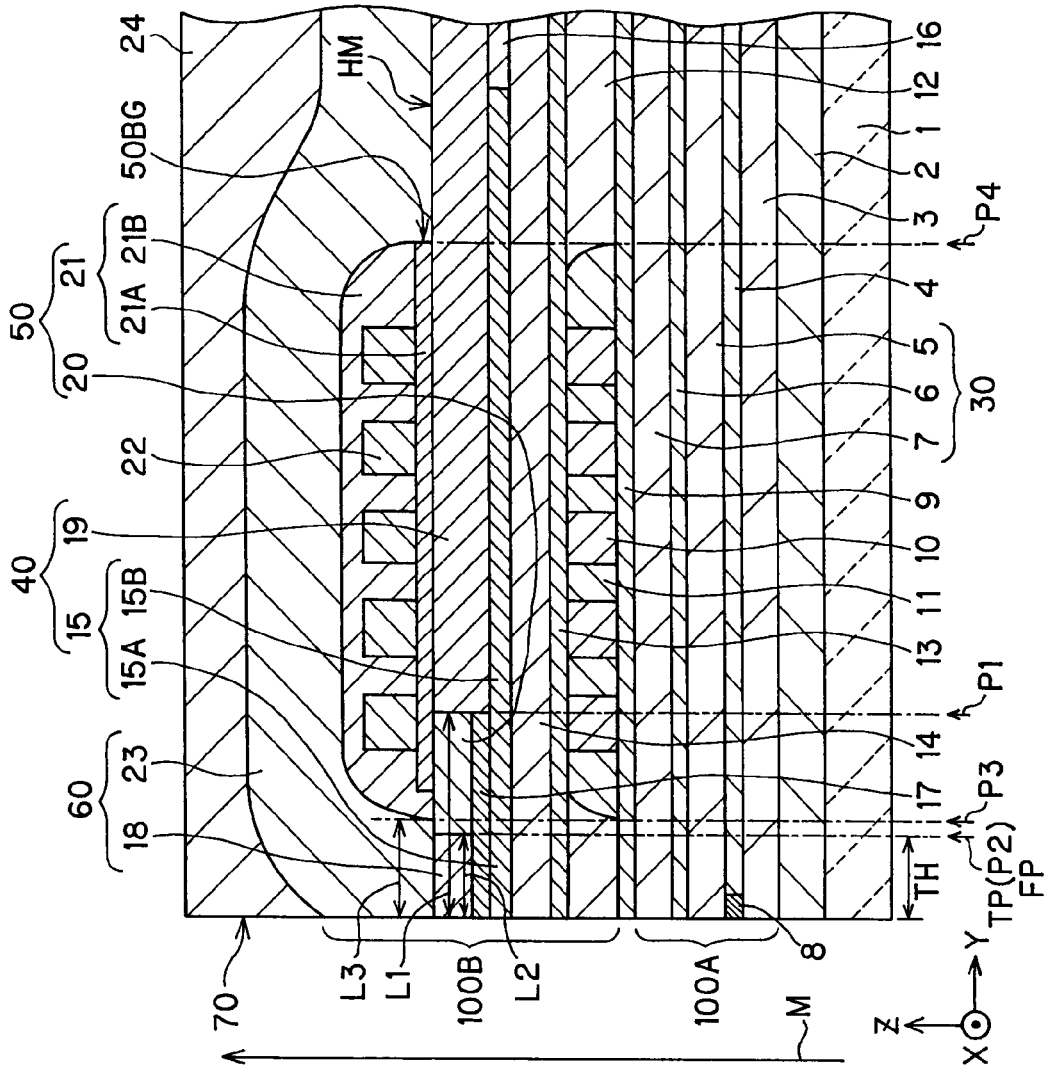
FIG. 6A is illustrative in section of the thin-film magnetic head parallel with the so-called air bearing surface (ABS)
FIG. 6B is illustrative in section of the thin-film magnetic head orthogonal to the air bearing surface.
Figure 7:
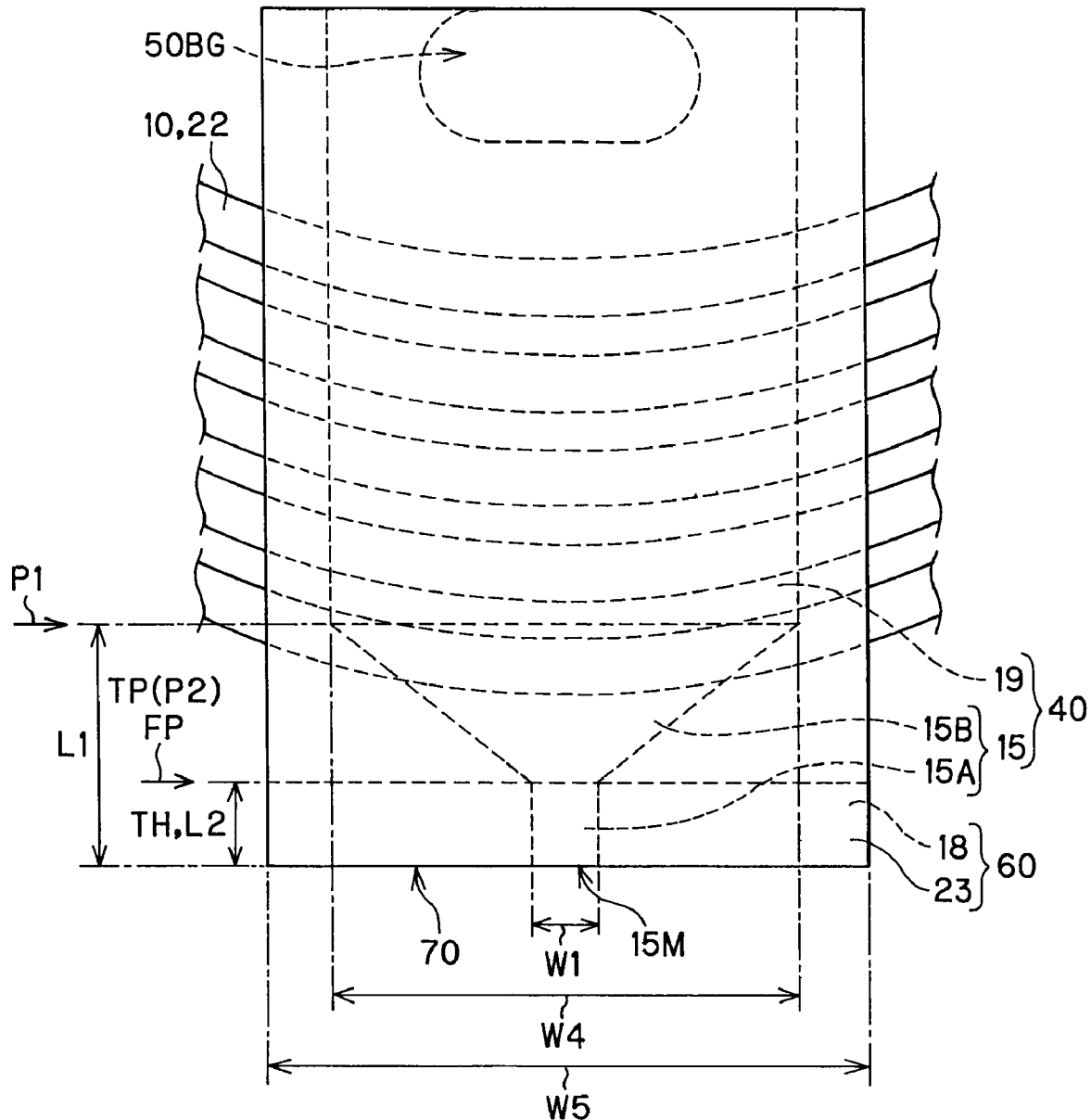
FIG. 7 is an enlarged perspective view of a portion near the magnetic pole layer of the write head.
Figure 8:
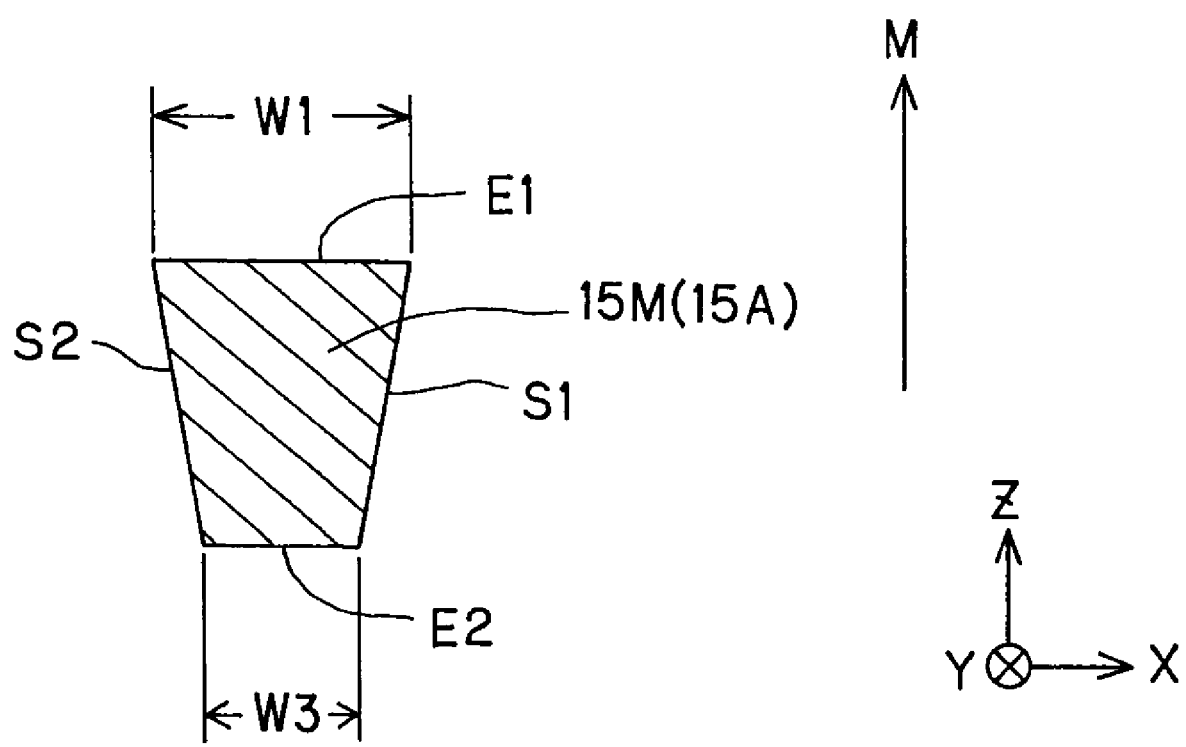
FIG. 8 is illustrative of the morphology of an end portion of the main magnetic pole at the air bearing surface.

FIG. 6A is illustrative in section of the thin-film magnetic head parallel with the so-called air bearing surface (ABS), and FIG. 6B is illustrative in section of the thin-film magnetic head perpendicular to the air bearing surface. The air bearing surface (ABS) here is equivalent to the plane (also called the medium opposite plane) at which the thin-film magnetic head is in opposition to a magnetic recording medium. FIG. 7 is an enlarged plan view of the thin-film magnetic head near a magnet pole layer adapted to implement perpendicular magnetic recording, and FIG. 8 is illustrative of the morphology of an end portion of a main magnetic pole at the air bearing surface.

The thin-film magnetic head shown in FIGS. 6A and 6B is used on a magnetic recording system such as a hard disk drive for the purpose of applying magnetic processing to a recording medium like a hard disk drive moving in the medium travel direction M.

For instance, the thin-film magnetic head illustrated in the drawings is a composite type head capable of implementing both recording and reproducing as magnetic processing. The structure comprises, as shown in FIG. 6, a substrate 1 made of a ceramic material such as AlTiC ($Al_2O_3.TiC$), and an insulating layer 2 made of a nonmagnetic insulating material such as aluminum oxide ($Al_2O_3$; hereinafter referred simply as alumina), a reproducing head portion 100A adapted to reproduce magnetic information recorded by harnessing the magneto-resistive (MR) effect, a separation layer 9 made of a nonmagnetic insulating material such as alumina, a shield type recording head portion 100B adapted to implement a perpendicular recording mode of recording processing, and an overcoat layer 24 made of a nonmagnetic insulating material such as alumina, all stacked one upon another on the substrate 1 in that order.

In the embodiment illustrated, the reproducing head portion 100A has a multilayer structure comprising a lower read shield layer 3, a magneto-resistive effect unit 8, and a shield layer 5 (in this embodiment, a part of an upper read shield layer 30) stacked one upon another in that order. At the rear end face of the magneto-resistive effect unit 8 there is a shield gap layer 4 formed.

In the embodiment shown in FIGS. 6A and 6B, both the lower 3 and the upper read shield layer 30 have a function of separating the magneto-resistive effect unit magnetically from the surroundings, extending rearward from the air bearing surface 70.

In the embodiment here, the upper read shield layer 30 has a structure in which a nonmagnetic layer 6 is sandwiched between two shield layers 5 and 7. In other words, that upper read shield layer 30 has a structure where the upper first read shield layer 5, the nonmagnetic layer 6 and the upper second read shield layer 7 are stacked one upon another in order from a side near to the shield gap film 4.

The upper first read shield layer 5 is made of a magnetic material such as permalloy, and has a thickness of typically about 1.5 µm. The upper second read shield layer 7 is made of a magnetic material such as permalloy, too, and has a thickness of typically about 1.1 µm. The nonmagnetic layer 6 is made of a nonmagnetic material such as ruthenium (Ru) or alumina, and has a thickness of typically about 0.2 µm.

While it is shown and described that the upper read shield layer 30 has a multilayer structure, it is contemplated that it is not always required to have a multilayer structure; it could have a single-layer structure as is the case with the lower read shield layer 3.

The shield gap film 4, for instance, made of a nonmagnetic material such as alumina.

The recording head portion 100B, for instance, has a multilayer structure comprising a first-stage thin-film coil 10 buried around with insulating layers 11, 12, 13, a nonmagnetic layer 14, a main magnetic pole layer 40 partially buried around with an insulating layer 16, a gap layer 17, a second-stage thin-film coil 22 buried with an insulating layer 50 that forms a magnetic coupling opening (back gap 50BG) and a write shield layer 60, all stacked one upon another in order.

In FIG. 7, only a main part (thin-film coils 10, 22, main magnetic pole layer 40 and write shield layer 60) extracted out of the recording head portion 100B is primarily shown.

The thin-film coil 10 has a primary function of generating a leakage-preventive magnetic flux for holding back leakage of a recording magnetic flux produced at the thin-film coil 22. This thin-film coil 10 is made of a highly electroconductive material such as copper, and has a thickness of typically about 2.0 µm.

As typically shown in FIGS. 6 and 7, the thin-film coil 10 in particular has a spiral structure having turns about the back gap 50BG. The thin-film coil 10 typically operates such that currents flow in a direction opposite to the direction taken by currents flowing through the thin-film coil 22. While it is shown in FIGS. 6 and 7 that the thin-film coil 10 has five turns by way of illustration alone, it is contemplated that the number of turns could optionally be varied. Preferably, the thin-film coil 10 should have as many turns as the thin-film coil 22, for instance, 2 to 7 turns. The thin-film coil 10 may also be configured as a helical coil.

The insulating layers 11, 12, 13 are formed in such a way as to separate the thin-film coil 10 electrically from the surroundings. The insulating layer 11 is formed in such a way as to be filled up between the turns of the thin-film coil 10 and provide a cover around the thin-film coil 10. This insulating layer 11 is made of a non-magnetic insulating material such as a photoresist exhibiting fluidity upon heating, and has a thickness of typically about 2.0 µm.

In the embodiment here, the insulating layer 11 is formed in such a way as to cover only the sides of the thin-film coil 10 but provide no cover to the upper side of the thin-film coil 10, as shown in FIG. 6.

The insulating layer 12 is formed in such a way as to provide a cover around the insulating layer 11. This insulating layer 12 is made of a nonmagnetic material such as alumina, and has a thickness of typically about 2.0 µm.

The insulating layer 13 is formed in such a way as to give a cover to the thin-film coil 10 as well as the insulating layers 11, 12. This insulating layer 13 is made of a nonmagnetic material such as alumina, and has a thickness of typically about 0.2 µm.

The nonmagnetic layer 14 is formed of a nonmagnetic insulating material such as alumina, or a nonmagnetic electroconductive material such as ruthenium, and has a thickness of typically about 1.0 µm.

The main magnetic pole layer 40 has a primary function of implementing recording processing by receiving a magnetic recording magnetic flux produced at the thin-film coil 22 and releasing that magnetic flux toward the recording medium for implementing recording processing. More specifically, the main magnetic pole layer 40 is to generate a magnetic field (perpendicular magnetic field) to magnetize the recording medium in a direction orthogonal to its surface on the basis of a recording magnetic flux, thereby implementing recording processing in the perpendicular recording mode.

Such main magnetic pole layer 40 is located on the leading side of the thin-film coil, extending rearward from the air bearing surface 70, more specifically, as far as the back gap 50BG. It is noted that when the state of movement of the recording medium that moves toward the medium travel direction M shown in FIG. 6 is viewed as a sort of flow, the aforesaid "leading side" would refer to the incoming side (opposite to the medium travel direction M side) of that flow that is here corresponding to the upstream side in the thickness (Z-axis) direction. By contrast, the outgoing side of the flow (the medium travel direction M side) would be called the "trailing side" that is here corresponding to the downstream side in the thickness direction.

In the embodiment here, the main magnetic pole layer 40 has a structure where, as shown in FIG. 6, a main magnetic pole 15 and a magnetic pole main layer 19 are stacked one upon another in order and thereby coupled to each other. In other words, it has a multilayer (double-layer) structure where the main magnetic pole 15 is located on the leading side and the magnetic pole main layer 19 is located on the trailing side.

The main magnetic pole 15 functions as a portion for releasing off a main writing magnetic flux. This main magnetic pole 15 extends rearward from the air bearing surface 70 on the leading side, more specifically, as far as the back gap 50BG, and has a thickness of typically about 0.25 µm. Such main magnetic pole 15, for instance, is made of an iron alloy or the like. The iron alloy here, for instance, includes an iron-nickel alloy (FeNi), an iron-cobalt alloy (FeCo) or an iron-cobalt-nickel alloy (FeCoNi), all rich in iron (Fe).

It is noted that the aforesaid "coupled" would mean just only a coupling involving physical contact but also a coupling involving physical contact plus a magnetically conductive coupling.

As shown in FIG. 7, for instance, the main magnetic pole 15 is configured in a generally battledore type planar shape. To be more specific, the main magnetic pole 15 comprises, in order from the air bearing surface 70, a front end 15A that extends rearward from that air bearing surface 70 and having a constant width W1 for defining the recording track width of the recording medium and a rear end 15B that is linked to the rear of that front end 15A and having a width W4 greater than the width W1 (W4>W1). The position at which the width of the main magnetic pole 15 starts growing wide from the front end 15A (of width W1) toward the rear end 15B (of width W4) is a "flare point FP" that is one of important determinants for the recording performance of the thin-film head. Note here that the main magnetic pole 15 may contact the magnetic pole main layer 19 from its bottom (substrate side) alone, thereby linking magnetically to it.

The front end 15A is primarily adapted to substantially release a recording magnetic flux produced at the thin-film coil 22 toward the recording medium, and has an exposed surface 15M exposed on the air bearing surface 70, as shown in FIG. 7.

As shown typically in FIG. 8, the exposed surface 15M takes a planar shape defined by an upper end edge (one end edge) E1 positioned on the trailing side, a lower end edge (another end edge) E2 positioned on the leading side, and two side end edges S1 and S2. To be more specific, the exposed surface 15M typically assumes on a trapezoidal shape with its width becoming gradually narrow from the trailing side toward the leading side (W1>W3). The trailing edge T1 of the front end 15A provides a substantial recording site of the magnetic pole layer 40.

The rear end 15B shown in FIG. 7 is adapted to receive the magnetic flux received in the magnetic pole main layer 19 and feed it to the front end 15A. Typically, the width of this rear end 15B remains constant (width W4) in the rear, and becomes gradually narrow from width W4 to width W1 in the front as the front end 15A comes near.

The magnetic pole main layer 19 functions as a portion adapted to receive a dominant magnetic flux. Typically, this magnetic pole main layer 19 extends rearward from a position P1 (the first position) receded from the air bearing surface 70. To be more specific, it extends as far as the rear of the main magnetic pole 15 at the back gap 50BG, and has a thickness of typically about 0.45 μm. In particular, the magnetic pole main layer 19 is made of a magnetic material having a saturation magnetic flux density lower than that forming the main magnetic pole 15, preferably, an iron-cobalt-nickel alloy.

As shown typically in FIG. 7, the magnetic pole main layer 19 has a rectangular planar shape of width W4. In the magnetic pole main layer 19 in particular, both an auxiliary insulating layer 20 of the insulating layer 50 to be described later and a TH defining layer 18 of the write shield layer 60 to be described later are flattened. That is, the end face of the magnetic pole main layer 19 on the trailing side forms a flat plane HM together with the end face of the auxiliary insulating layer 20 on the trailing side and the end face of the TH defining layer 18 on the trailing side.

The insulating layer 16 is provided to isolate the main magnetic pole 15 electrically from the surroundings. This insulating layer 16 is made of a nonmagnetic insulating material such as alumina, and has a thickness of typically about 0.25 μm.

The gap layer 17 is formed in such a way as to provide a gap for the magnetic separation of the magnetic layer 40 from the write shield layer 60. As typically shown in FIG. 6, the gap layer 17 extends rearward from the air bearing surface 70 along the main magnetic pole 15 except an area with the magnetic pole main layer 19 located on it. In particular, the gap layer 17 is made of a nonmagnetic insulating material such as alumina or a nonmagnetic electroconductive material such as ruthenium, and has a thickness of typically about 0.03 to 0.1 μm.

The insulating layer 50 defines the throat height TH that is one of important determinants for the recording performance of the thin-film magnetic head, and is adapted to cover the thin-film coil 22 in such a way as to isolate it electrically from the surroundings. As shown in FIG. 6, the insulating layer 50 has a structure wherein an auxiliary insulating layer 20 (the first insulating layer portion) formed in such a way as to substantially define the throat height TH and a main insulating layer 21 (the second insulating layer portion) formed in such a way as to substantially cover the thin-film coil 22 are stacked one upon another in that order. It follows that there is a multilayer (double-layer) structure involved, wherein the auxiliary insulating layer 20 is located on the leading side and the main insulating layer 21 is located on the trailing side.

As shown in FIG. 6, the auxiliary insulating layer 20 extends along the gap layer 17 and from a position receded from the air bearing surface 70, viz., a position P2 (the second position) between the air bearing surface 70 and a position P1 to the position P1 in the rear. And, the auxiliary insulating layer 20 is provided in such a way as to be adjacent to the magnetic pole main layer 19 at the position P1, and adjacent to the write shield layer 60 (the TH defining layer 18 to be described later) at the position P2. In the embodiment here in particular, the auxiliary insulating layer 20 defines a flat plane HM together with the magnetic pole main layer 19 and TH defining layer 18.

The aforesaid "position P2" is corresponding to the foremost end position of the insulating layer 50 (nearest to the air bearing surface 70). That is, there is a "zero throat height position TP" for defining the throat height TH. That throat height TH is a distance between the air bearing surface 70 and the zero throat height position TP. This auxiliary insulating layer 20 is made of a nonmagnetic insulating material such as alumina. In the embodiment shown in FIGS. 6 and 7, the zero throat height position TP is in coincidence with the flare point FP.

As shown in FIG. 6, the main insulating layer 21 extends rearward from a position P3 (the third position) between the positions P1 and P2 while lying along the flat plane HM of the auxiliary insulating layer 20. More specifically, the main insulating layer 21 extends in such a way as not to fill up the back gap 50BG, and is receded from the auxiliary insulating layer 20. As shown typically in FIG. 6, this main insulating layer 21 comprises a main insulating layer portion 21A that is located as an underlay of the thin-film coil 22 on the flat plane HM of the auxiliary insulating layer 20, and a main insulating layer portion 21B that is located in such a way as to cover the thin-film coil 22 and the main insulating layer portion 21A around it.

The main insulating layer portion 21A is made of a nonmagnetic material such as alumina, and has a thickness of typically about 0.2 μm.

The main insulating layer portion 21B is made of a nonmagnetic insulating material such as a photoresist or spin-onglass (SOG) that exhibits fluidity upon heating. A portion of this main insulating layer portion 21B at and near its end edge is in such a rounded slant shape as to fall away toward that end edge.

The thin-film coil 22 is formed for the generation of a recording magnetic flux. For instance, the thin-film coil 22 operates such that currents flow in the direction opposite to the direction taken by currents through the aforesaid thin-film coil 10.

The write shield layer 60 works capturing the spreading component of a recording magnetic flux released off the magnetic pole layer 40, thereby holding back the spreading of that magnetic flux. Located on the trailing side of the main magnetic pole layer 40 and thin-film coil 22, the write shield layer 60 extends rearward from the air bearing surface 70, whereby it is spaced by the gap film 17 away from the magnetic pole layer 20 on its side near to the air bearing surface 70, and linked to the magnetic layer 40 through the back gap 50BG in its side far away from the air bearing surface 70.

The write shield layer 60 here comprises the TH defining layer 18 (the first magnetic shield layer portion) and a yoke layer 23 (the second magnetic shield layer portion) that are separate from each other, and has a structure wherein the TH defining layer 18 and yoke layer 23 are coupled to each other. It is here noted that the write shield layer 60 is not limited to the coupled structure as shown; it may be an integral structure.

The TH defining layer 18 functions as a dominant magnetic flux inlet port adapted to capture an extra portion of the magnetic flux released directly from the magnetic pole. As shown typically in FIG. 6, this TH defining layer 18 extends from the air bearing surface 70 as far as a position in the rear, more specifically, as far as the position P2 in front of the position P1 while lying adjacent to the gap layer 17, so that at that position P2 it lies adjacent to the auxiliary insulating layer 20 of the insulating layer 50.

The TH defining layer 18 is made of a magnetic material having a high saturation flux density such as permalloy or iron alloys, and assumes on a rectangular planar shape having a width W5 larger than the width W4 of the main magnetic pole layer 40 (W5>W4), as shown in FIG. 7. In particular, the TH defining layer 18 forms the flat plane HM together with the magnetic pole main layer 19 and auxiliary insulating layer 20, as typically described above. In other words, the end face of the TH defining layer 18 on the trailing side forms the flat plane HM together with both the end face of the magnetic pole main layer 19 on the trailing side and the end face of the auxiliary insulating layer 20 on the trailing side. The TH defining layer 18 lies adjacent to the auxiliary insulating layer 20 at the position P2 as described above; that is, the TH defining layer 18 takes a substantial role of defining the foremost end position of the insulating layer 50 (the zero throat height position TH), thereby defining the throat height TH.

The yoke layer 23 is set up in such a way as to function as a passage for the magnetic flux captured out of the TH defining layer 18, and function as a return yoke for allowing the magnetic flux to go back from the lining layer of the medium. As shown typically in FIG. 6, the yoke layer 23 goes over the TH defining layer 18, extending at least as far as the back gap 50BG from the air bearing surface 70 via on the insulating layer 50. In other words, in the front, there is the yoke layer 23 going over the TH defining layer 18 and linked to it, and in the rear, there is the yoke layer 23 lying adjacent to the main magnetic pole layer 40 through the back gap 50BG and linked to it.

In the embodiment here, for instance, the yoke layer 23 extends as far as the rear of the back gap 50BG while linked to the main magnetic pole layer 40 at the back gap 50BG. Such yoke layer 23, for instance, is made of a magnetic material similar to that of which the TH defining layer 18 is made, and takes a rectangular planar shape having a width W5 as shown in FIG. 7.

For such a thin-film magnetic head as described above, it is desired that constant dimensions defined on the basis of a specific component element be optimized to make sure recording performance, as typically shown in FIG. 6. More specifically, the distance of the auxiliary magnetic pole 19 receded from the air bearing surface 70, viz., the distance L1 between the air bearing surface 70 and the position P1 should preferably be 0.8 to 7.1 μm. The distance of the main insulating layer 21 receded from the air bearing surface 70, viz., the distance L3 between the air bearing surface 70 and the position P3 should be greater than the length of the TH defining layer 18, viz., the distance L2 between the air bearing surface 70 and the position P2 (L3>L2). In consideration of the structural relation where the distance L3 is greater than the distance L2, the write shield layer 60 is designed such that the length of a portion of the yoke layer 23 adjacent to the TH defining layer 18 (viz., the distance L3) is greater than the length of the TH defining layer (viz., the distance L2). In other words, when the magnetic flux is captured in the yoke layer 23 of the write shield layer 60 via the TH defining layer 18, the magnetic path taken by that magnetic flux flowing through the write shield layer 60 is incrementally expanded.

It is here noted that the whole structure of the thin-film magnetic head as described above is never limited to that described above, and so may be modified in various ways.

Such a thin-film magnetic head may mainly be fabricated by forming and stacking together component elements using existing thin-film processes inclusive of film-formation techniques as represented by plating or sputtering, patterning techniques as represented by photo-lithography, and etching techniques as represented by drying etching or wet etching.

[Explanation of the Head Gimbal Assembly and the Hard Disk System]

One example of the head gimbal assembly or the hard disk system as described above, with the foregoing thin-film head mounted on it, is now explained.

A slider 210 included in the head gimbal assembly is first explained with reference to FIG. 9. In the hard disk system, the slider 210 is located in such a way as to face a hard disk that is a rotationally driven disk-form recording medium. This slider 210 primarily comprises a substrate 211 built up of a substrate and overcoat.

The substrate 211 is in a generally hexahedral shape. Of the six surfaces of the substrate 211, one surface is in opposition to the hard disk. On that one surface there is the air bearing surface 30 formed.

Figure 9:
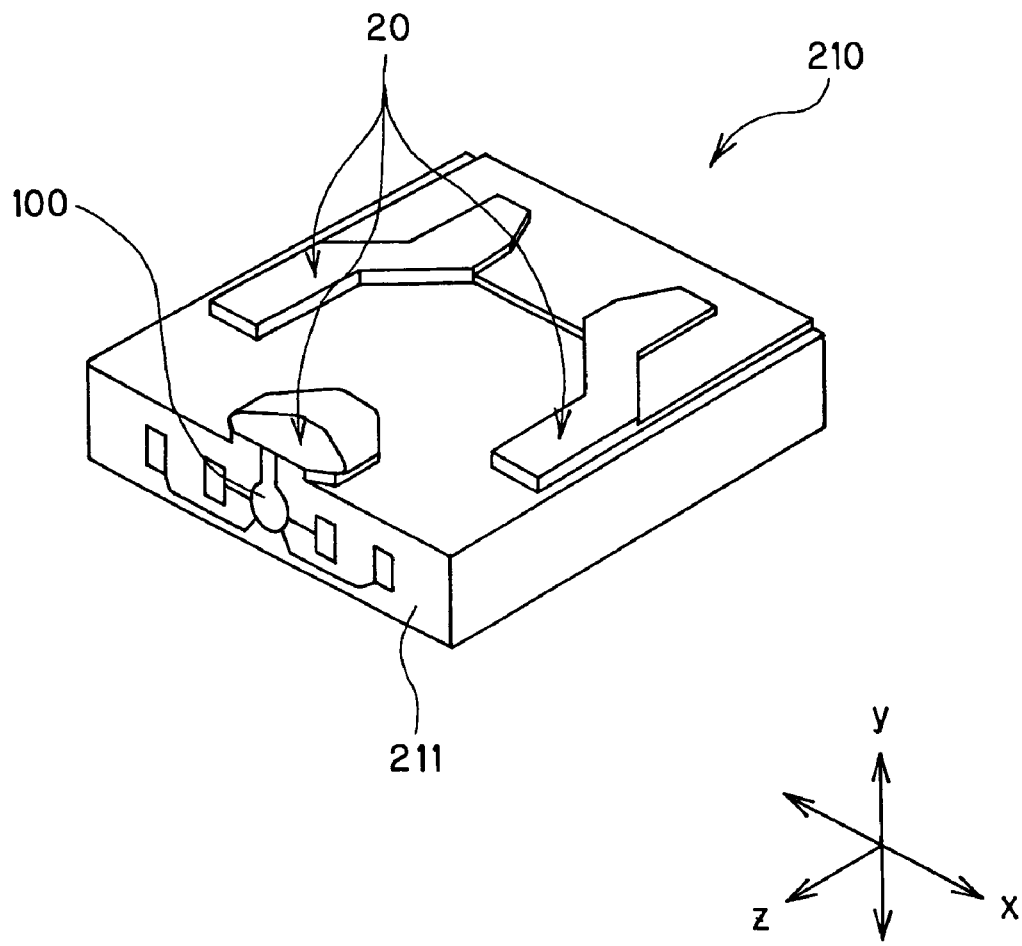
FIG. 9 is illustrative in perspective of the slider included in the head gimbal assembly according to one embodiment of the invention.

As the hard disk rotates in the z-direction in FIG. 9, it causes an air flow passing between the hard disk and the slider 210 to induce lift relative to the slider 210 in the downward y-direction in FIG. 9. This lift in turn causes the slider 210 to levitate over the surface of the hard disk. Note here that the x direction in FIG. 9 traverses tracks on the hard disk.

Near the end of the slider 210 on an air exit side (the left lower end in FIG. 9), there is the thin-film magnetic head formed according to the embodiment here.

A head gimbal assembly 220 according to this embodiment is now explained with reference to FIG. 10. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 10:
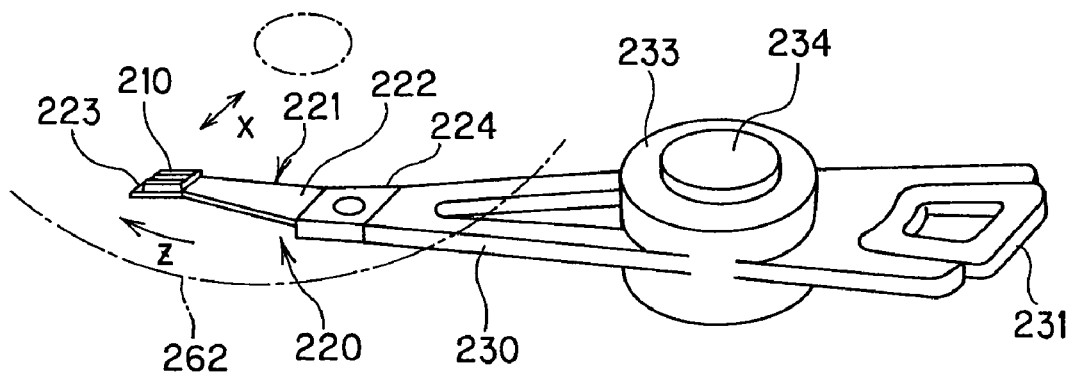
FIG. 10 is illustrative in perspective of the head arm assembly comprising the head gimbal assembly according to one embodiment of the invention.

FIG. 10 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here are now explained with reference to FIGS. 11 and 12.

Figure 11:
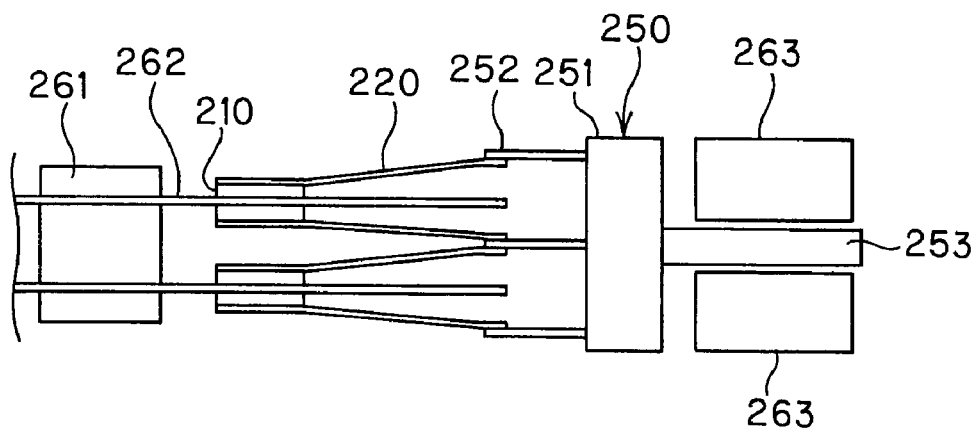
FIG. 11 is illustrative of part of the hard disk system according to one embodiment of the invention.
Figure 12:
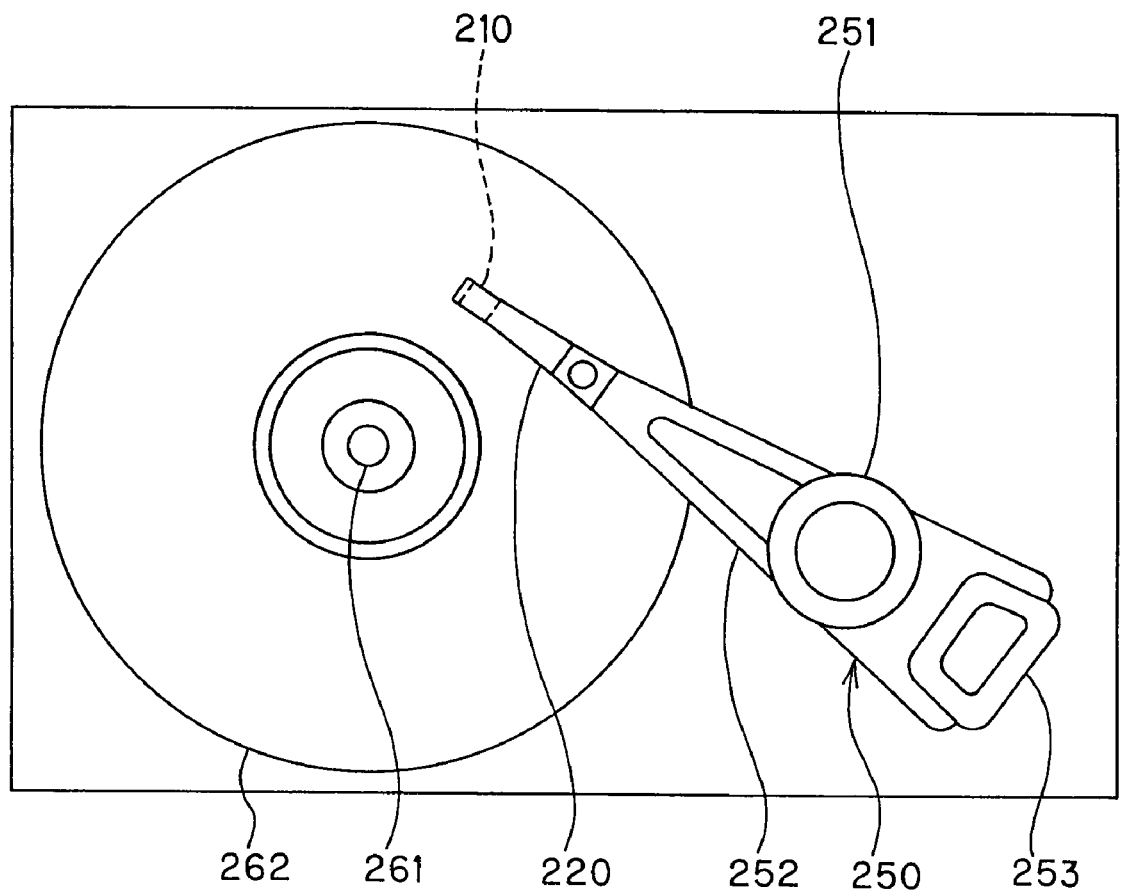
FIG. 12 is a plan view of the hard disk system according to one embodiment of the invention.

FIG. 11 is illustrative of part of the hard disk system, and FIG. 12 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

EXPERIMENTAL EXAMPLES

The invention is now explained in further details with reference to some specific examples of the inventive magneto-resistive effect device.

Experimental Example 1

Experimentation was carried out to learn what influences the angle θ of magnetization of the inclined magnetization structure formed at the upper shield layer and the thickness h (see FIG. 3) of the upper shield layer had on the bias magnetic field generated (leaking) from the upper shield layer.

The angle θ of magnetization was changed to 5°, 10°, 15°, 20°, 25°, 30°, 35°, 40°, 45°, 55°, 70°, and 90°, respectively, and the thickness h of the upper shield layer was changed to 5 nm, 100 nm, and 200 nm, respectively.

Figure 13:
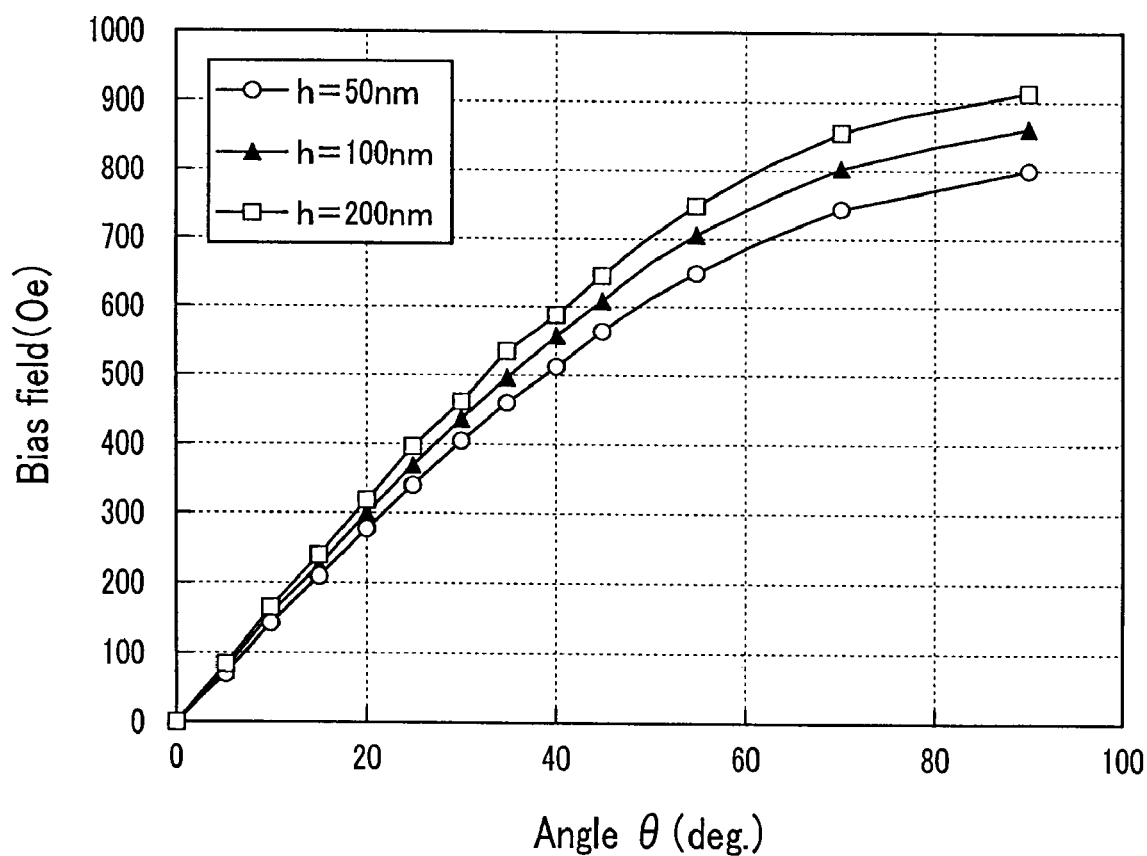
FIG. 13 is a graph indicative of the results of experimentation for learning the influences on the bias magnetic field given out of the upper shield layer of the angle θ of magnetization of the inclined magnetization structure formed at the upper shield layer, and the thickness h of the upper shield layer.
Figure 14:
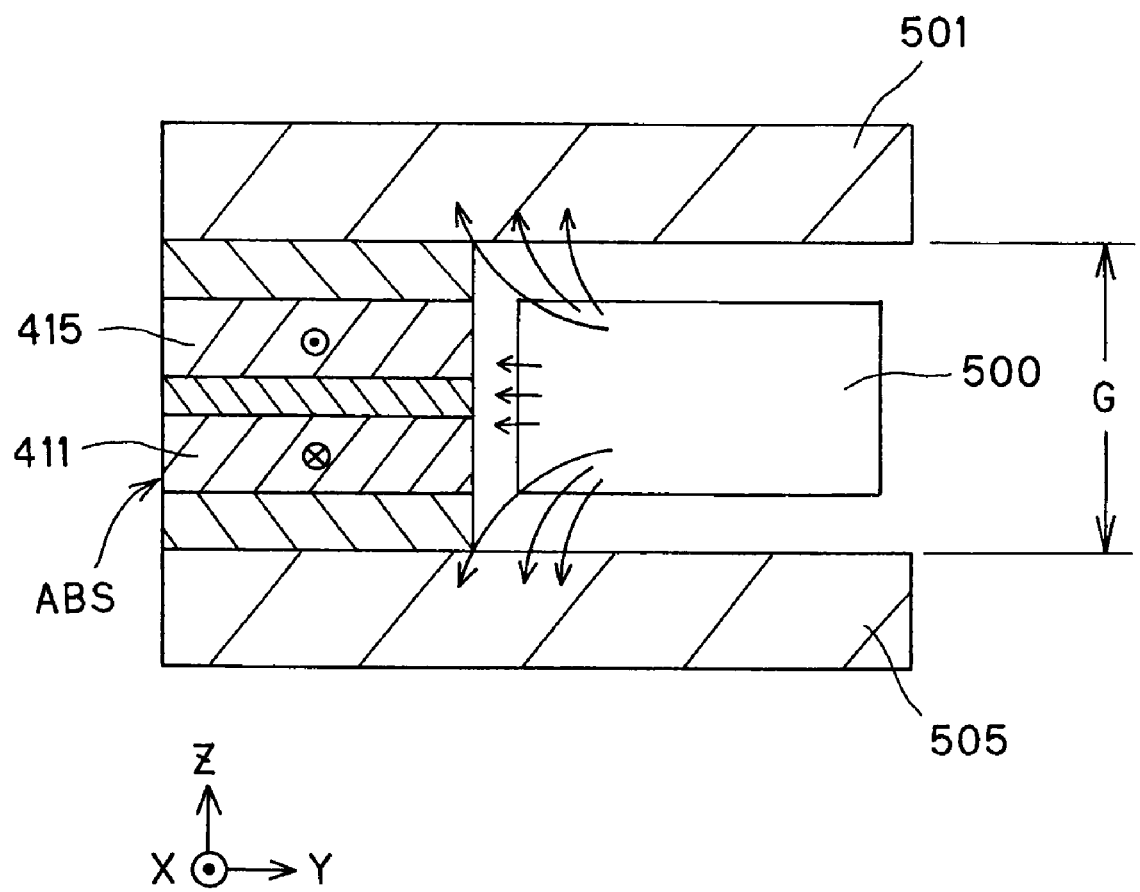
FIG. 14 is illustrative of conventional bias magnetic field-applying means and problems with it.

The results are plotted in the graph of FIG. 13 with the angle θ of magnetization as abscissa and the bias magnetic field leaking from the upper shield layer as ordinate. The parameter is the thickness h of the upper shield layer. It is seen that as the angle θ of magnetization increases, so does the bias magnetic field. It is seen that when the angle θ of magnetization is 45°, a bias magnetic field of about 600 Oe is applied, and that even at an angle θ of magnetization of about 10°, a bias magnetic field of about 150 Oe is applied.

It is also seen that the influence of the thickness h of the upper shield layer is little in the range of h=50 to 200 nm. It is found that even when the thickness h doubles, the bias magnetic field does not proportionally double: there is not that much fluctuation.

Experimental Example 2

As shown in Table 1, the magneto-resistive effect unit 8 was formed on the lower shield layer 3 made of a 100-nm thick NiFe, the upper shield layer 5 made of a 100-nm thick NiFe was formed on that magneto-resistive effect unit 8, and the antiferromagnetic member 5a made of IrMn was formed on that upper shield layer 5.

The magneto-resistive effect device 8 was formed such that the first ferromagnetic layer 130 made of a 5-nm thick CoFe and the second ferromagnetic layer 150 made of a 5-nm thick CoFe were exchange coupled to each other via the nonmagnetic metal intermediate layer 140 made of a 1.0-nm thick Cu.

By exchange coupling with the antiferromagnetic member 5a made of IrMn, the upper shield layer 5 had its angle θ of magnetization set at 45°.

As a result of using such a magnetic field sensor to detect signal magnetic fields from the medium corresponding to −400 Oe to 400 Oe, it was found that there can be a practically available magnetic resistance change obtained.

TABLE 1

| Multilayer Structure | | Layer Material | Thickness (nm) |
|---|---|---|---|
| Antiferromagnetic Member | | IrMn | 7 |
| Upper Shield Layer | | NiFe | 100 |
| Magneto-Resistive Effect | Second Ferromagnetic Layer | CoFe | 5 |

TABLE 1-continued

| Multilayer Structure | | Layer Material | Thickness (nm) |
|---|---|---|---|
| Device | Nonmagnetic Metal Intermediate Layer | Cu | 1.0 |
| | First Ferromagnetic Layer | CoFe | 5 |
| Lower Shield Layer | | NiFe | 100 |

From the aforesaid results, the advantages of the invention would be undisputed. That is, the present invention provides a magneto-resistive effect device of the CPP (current perpendicular to plane) structure, comprising a magneto-resistive effect unit, and an upper shield layer and a lower shield layer located with that magneto-resistive effect unit sandwiched between them, with a sense current applied in a stacking direction, wherein said magneto-resistive effect unit comprises a nonmagnetic metal intermediate layer, and a first ferromagnetic layer and a second ferromagnetic layer stacked and formed with that nonmagnetic metal intermediate layer sandwiched between them, wherein said first ferromagnetic layer and said second ferromagnetic layer are exchange coupled via the nonmagnetic metal intermediate layer such that where there is no bias magnetic field applied, their magnetizations are anti-parallel with each other, and at least one of said upper shield layer and said lower shield layer has an inclined magnetization structure with its magnetization inclining with respect to a track width direction, so that by the magnetization of that inclined magnetization structure, a bias magnetic field can be applied to said first ferromagnetic layer and said second ferromagnetic layer. It is thus possible to obtain a magneto-resistive effect device of improved reliability that enables a structure capable of having a narrowed read gap (the gap between the upper shield and the lower shield) to be adopted to meet the recently demanded ultra-high recording density, allows a stable bias magnetic field to be applied in simple structure, and obtain a stable magneto-resistive effect change.

INDUSTRIAL APPLICABILITY

The present invention could be applied to the industry of magnetic disk systems comprising a magneto-resistive effect device operable to read the magnetic field intensity of magnetic recording media or the like as signals.

We claim:

1. A magneto-resistive effect device of a CPP (current perpendicular to plane) structure, comprising a magneto-resistive effect unit, and an upper shield layer and a lower shield layer located and formed with that magneto-resistive effect unit sandwiched between them, with a sense current applied in a stacking direction, characterized in that:

said magneto-resistive effect unit comprises a nonmagnetic metal intermediate layer, and a first ferromagnetic layer and a second ferromagnetic layer stacked and formed with that nonmagnetic metal intermediate layer sandwiched between them, wherein:

said first ferromagnetic layer and said second ferromagnetic layer are exchange coupled via the nonmagnetic metal intermediate layer such that where there is no bias magnetic field applied, their magnetizations are anti-parallel with each other, and at least one of said upper shield layer and said lower shield layer has an inclined magnetization structure with its magnetization inclining with respect to a track width direction, so that by magnetization of that inclined magnetization structure, a bias magnetic field can be applied to said first ferromagnetic layer and said second ferromagnetic layer, wherein said inclined magnetization structure has a degree of inclination of magnetization such that while said upper shield layer and said lower shield layer maintain their own shield function, substantial orthogonal intersection of magnetization of said first ferromagnetic layer and magnetization of said second ferromagnetic layer is achievable.

2. The magneto-resistive effect device according to claim 1, wherein the inclined magnetization structure formed at said at least one shield layer is formed by exchange coupling with an antiferromagnetic member adjacent to said shield layer.

3. The magneto-resistive effect device according to claim 1, wherein the inclined magnetization structure formed at said at least one shield layer is formed by application of an induced magnetic anisotropy to said shield layer.

4. The magneto-resistive effect device according to claim 3, wherein by heat treatment in a magnetic field, the induced magnetic anisotropy is applied to said at least one shield layer.

5. The magneto-resistive effect device according to claim 1, wherein a flux guide layer is formed more in the rear of a rear end of said magneto-resistive effect device such that said bias magnetic field is pulled from a medium opposite plane of the magneto-resistive effect device in the rear end of the device.

6. The magneto-resistive effect device according to claim 1, wherein a gap defined by a gap said upper shield layer and said lower shield layer is 30 nm or less.

7. The magneto-resistive effect device according to claim 1, wherein the substantial orthogonal intersection of magnetization of said first ferromagnetic layer and magnetization of said second ferromagnetic layer is in a range of $90°\pm15°$.

8. A thin-film magnetic head, characterized by comprising:
a plane in opposition to a recording medium, and
a magneto-resistive effect as recited in claim 1, that is located near said medium opposite plane to detect a signal magnetic field from said recording medium.

9. A head gimbal assembly, characterized by comprising:
a slider including a thin-film magnetic head as recited in claim 8 and located in opposition to the recording medium, and
a suspension adapted to resiliently support said slider.

10. A hard disk system, characterized by comprising:
a slider including a thin-film magnetic head as recited in claim 8 and located in such a way as to oppose to a recording medium, and
a positioning device adapted to support and position said slider with respect to said recording medium.

* * * * *